United States Patent [19]

Fujimura et al.

[11] 4,393,807
[45] Jul. 19, 1983

[54] SPINNER

[75] Inventors: Shuzo Fujimura; Atsuyuki Yasuda, both of Yokohama, Japan

[73] Assignee: Fujitsu Limited, Kawasaki, Japan

[21] Appl. No.: 187,515

[22] Filed: Sep. 15, 1980

[30] Foreign Application Priority Data

Sep. 19, 1979 [JP] Japan .................. 54/119242

[51] Int. Cl.³ .............................................. B05C 5/00
[52] U.S. Cl. ...................................... 118/501; 118/52; 118/320; 427/240; 134/33
[58] Field of Search .................. 427/240, 241; 118/50, 118/52, 501, 320, 506, 54; 269/21, 903; 134/33; 233/1 A, 13

[56] References Cited

U.S. PATENT DOCUMENTS 3,041,225 6/1962 Emets ................................ 134/33 X
3,950,184 4/1976 Adams et al. .................. 427/240 X

FOREIGN PATENT DOCUMENTS 52-5268 1/1977 Japan ..................................... 118/52
52-5269 1/1977 Japan ..................................... 118/52

Primary Examiner—John D. Smith
Assistant Examiner—Bernard F. Plantz
Attorney, Agent, or Firm—Staas & Halsey

[57] ABSTRACT

A spinner comprises a rotating spindle for causing a workpiece to spin at a high speed, and a cup disposed around the spindle and provided at a bottom wall thereof with a port for air evacuation. The cup comprises a deflector ring disposed in the interior of the cup and extending inwardly, the deflector ring having an annular barrier at the inner peripheral edge for defining steps projecting from the upper and lower surfaces of the ring, respectively, and the barrier having an inner peripheral surface formed to diverge at least upwardly with respect to the axis of the spindle.

6 Claims, 12 Drawing Figures

SPINNER

BACKGROUND OF THE INVENTION

This invention relates to a spinner which is, for example, used to apply a resist, liquid developer or the like to a wafer in the manufacture of semiconductor devices and, more particularly, to an improved structure of a cup of the spinner.

The spinner (which is also called "developer", according to its use) generally comprises a rotating spindle for causing a workpiece, such as a wafer, to spin at a high speed and a cup disposed about the rotating spindle. The workpiece is caused to spin within the cup at a high speed by the rotating spindle, while a liquid agent to be applied, such as resist, is sprayed onto the workpiece by means of a nozzle. As a result a film having a thin and uniform thickness is formed on the workpiece by virtue of the action of centrifugal force caused by the high speed of spinning. In a typical structure, for the purpose of avoiding bad influences caused by air in the interior of the cup and by the splashing of the agents to be applied, the cup is provided in the bottom wall thereof with a port for evacuation of air in the interior of the cup during the operation of the spinner.

In a conventional spinner, however, there is the problem that, in the case of applying the resist to a wafer, for example, various defects, such as an unevenness in application of the agents (commonly called "firework"), and an adhesion of resist balls and resist filaments, are apt to occur. It is understood that such defects depend on an interrelationship between a condition of an air current in the interior of the cup, that is produced by the spinning of the wafer as well as the evacuation of air, and the viscosity of the resist. For example, in a case where the viscosity of the resist is relatively low, if the rate of air evacuation is too high, an unevenness in application, i.e. "firework", is produced. This defect can be prevented from occurring by reducing the rate of air evacuation. In this case, however, there are problems, such as the production of resist balls, due to splashing of the resist from the inner wall of the cup, and an unevenness in the thickness of the film, due to an unevenness in the air evacuation. Therefore, reduction in the rate of air evacuation is not a practical and useful solution.

For ensuring a proper and even rate of air evacuation, a structure of the spinner cup has been used in which the cup is provided with a deflector ring and a base ring, or the like (for example, "Wafertrac", manufactured by GCA Co.). The deflector ring and the base ring are disposed on the upper side and the side adjacent to the bottom wall of the cup with the wafer positioned therebetween, and they are formed integrally with the cup or are attached securely to the cup. The deflector ring is normally formed to extend inwardly towards the central region of the cup interior, so as to substantially surround the periphery of the wafer, whereby the current of air to be evacuated is deflected and becomes even to a certain extent in the circumferential direction. The base ring is provided with a plurality of holes for air evacuation arranged approximately equidistantly in the circumferential direction. Through these holes the interior of the cup is communicated with the evacuation port formed in the bottom wall of the cup. According to this structure, since the air evacuation is effected through a plurality of evacuation holes formed in the base ring, the air evacuation can be effected approximately evenly in the circumferential direction, even though the cup is provided in the bottom wall with only one evacuation port. It is also possible to determine the number and size of the evacuation holes in the base ring so that a proper rate of air evacuation is provided.

However, in the structure of the cup provided with at least the deflector ring as mentioned above, there is the following problem. In the case where the rate of air evacuation is small or the evacuation holes are blocked up when a resist of a high viscosity (more than about 45 cp) is applied, the rate of air evacuation from the interior of the cup is reduced. Accordingly, the air current produced by the spin of the wafer collides with the inner wall of the cup and the deflector ring, so as to produce an ascending air current which flows out of the cup through an opening formed in a top cover of the cup. In this case, the resist splashes from the inner wall of the cup and the surface of the deflector ring so as to produce resist balls, and the resist applied to the surface of the deflector ring is thrown up by the ascending air current to produce resist filaments. Then, when the spinning of the wafer has been stopped, the ascending air current disappears, whereby the resist filaments fall and adhere to the surface of the wafer. For preventing the above mentioned defects from occurring, a method can be used in which the rate of air evacuation is increased and the evacuation holes in the base ring are made larger in diameter so as to prevent them from being blocked up. According to this method, however, in the case where the resist has a low viscosity of about 30 cp, the rate of air evacuation is too high and results in the occurrence of "firework", as mentioned hereinbefore. Therefore, such a method is not a good solution.

Finally, in the conventional structure of the spinner cup, there is the problem that, in relation to the viscosity of the agents to be applied, such as the resist, too high a rate of air evacuation results in the occurrence of the unevenness of application, i.e. "firework", and, on the contrary, too low of a rate of air evacuation results in the production of resist balls, due to splashing of the resist, and of resist filaments, due to the ascending air current.

SUMMARY OF THE INVENTION

It is, therefore, a primary object of the present invention to eliminate the occurrence of resist balls and resist filaments in the structure of the cup having a deflector ring or both a deflector ring and a base ring as mentioned above, thereby providing an improved spinner which can be used for agents to be applied in a wide range of viscosity.

In order to achieve the above mentioned object, the inventors of the present invention studied the cause of the production and adhesion of resist balls and resist filaments in the conventional structure of a cup, and found it is chiefly caused by the form of the deflector ring. It is, therefore, a specific object of the present invention to provide an improved structure of a cup and, in particular, an improved form of a deflector ring, which prevents the production of resist balls and resist filaments.

According to the present invention, there is provided a spinner comprising a rotating spindle for causing a workpiece to spin at a high speed, and a cup disposed around said spindle and provided at a bottom wall thereof with a port for air evacuation, wherein said cup comprises a deflector ring disposed in the interior of the cup and extending inwardly. The deflector ring has an annular barrier at the inner peripheral edge for defining steps projecting from the upper and lower surfaces of the ring, respectively, and said barrier has an inner peripheral surface formed to diverge at least upwardly with respect to the axis of the spindle. Preferably, the inner peripheral surface of the barrier of the deflector ring is formed to diverge both upwardly and downwardly with respect to the axis of the spindle.

It is preferable that the cup further comprises a base ring disposed under said deflector ring with a space defined between the base ring and the bottom of the cup, the base ring being provided with a plurality of air evacuation holes arranged approximately equidistantly in the circumferential direction, the interior of the cup being communicated with said evacuation port in the cup bottom wall through said air evacuation holes in the base ring, and said barrier of the deflector ring and said air evacuation holes in the base ring being in alignment with each other in the axial direction of said spindle. It is also preferable that the deflector ring have an outer peripheral wall for defining an annular space between said outer peripheral wall and the side wall of said cup, and said outer peripheral wall of the deflector ring be provided with a plurality of holes for air evacuation arranged approximately equidistantly in the circumferential direction, whereby the interior of the cup is also in communication with the air evacuation port in the bottom wall of the cup, via a second route including said annular space and the air evacuation holes in the outer peripheral wall of the cup.

The present invention will become more apparent from the description of preferred embodiments set forth below with reference to the accompanying drawings.

BRIEF DESCRIPTION OF THE DRAWINGS

Referring to FIG. 1, which diagrammatically illustrates a general construction of an embodiment of a spinner according to the present invention, RS denotes a rotating spindle, SC denotes a spinner cup, CV denotes a cover and W denotes a wafer which is caused to spin by the rotating spindle. The cover CV is equipped with a nozzle N for the supply of a resist to be applied to the wafer, and an aspirator ASP for the supply of an agent for the stability of the application of the resist. The cup SC is provided in the bottom wall thereof with an evacuation port EP, through which air in the interior of the cup is evacuated. The cup SC has a deflector ring DR, which surrounds the wafer W. The application of the resist to the wafer W is performed as the wafer W is caused to spin at a high speed by the spindle RS within the cup SC, while air in the interior of the cup SC is evacuated through the evacuation port EP. The rate of air evacuation is preliminarily defined so that, in the case of the application of a resist having a relatively low viscosity, there is no occurrence of unevenness of application of the agents, i.e., "firework".

Figure 1:
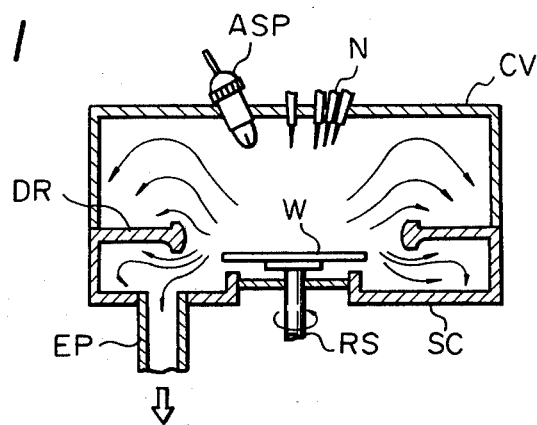
FIG. 1 is an axial sectional view diagrammatically illustrating a general construction of a first embodiment of a spinner according to the present invention.
Figure 2:
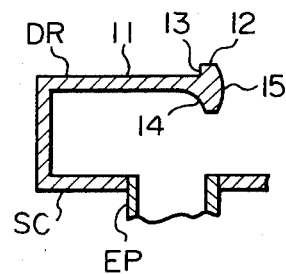
FIG. 2 is an enlarged sectional view partially illustrating a form of a cup and, in particular, of a deflector ring in the first embodiment.

A characteristic feature of the structure of the spinner cup according to the present invention resides chiefly in the form of the deflector ring DR, which is partially illustrated in section in FIG. 2. As is obvious from FIG. 2, the deflector ring DR is formed integrally with the cup SC, and has a ring body 11 in the form of a shelf, which extends inwardly from the top end of the side wall of the cup towards the central region of the cup, and an annular barrier 12 formed at the inner peripheral edge of the ring body. The barrier 12 projects from both the upper and lower surfaces of the ring body 11, so as to define steps 13 and 14, respectively. The barrier 12 also has an inner peripheral surface 15, which is curved convexly in a plane including the axis of the spindle RS (FIG. 1), so as to flare towards both the upper side (i.e. the side near the cover) and the lower side (i.e. the side near the cup bottom wall). This form of the deflector ring provides the effects described below.

Firstly, since the inner surface 15 of the barrier 12 is flared upwardly and downwardly, the air current flowing along the inner surface 15 goes around the upper and lower ends of the barrier 12, as illustrated by arrows in FIG. 1, thereby producing eddies at the steps 13 and 14. Hence, splashes of resist are mostly conveyed behind the barrier 12 and caught by both surfaces of the ring body 12, whereby there is almost no occurrence of resist adhering to, and splashing from, the inner wall of the cup and the inner surface 15 of the barrier. Even if the resist has adhered to the inner surface 15 of the barrier and the adhered resist has been thrown up by the ascending air current so as to produce resist filaments, the latter are conveyed behind the barrier with the ascending air current going around the barrier. This fact results in elimination of the problem that, after the spinning of the wafer has been stopped, the resist filaments fall on an adhere to the surface of the wafer.

Secondly, since the barrier 12 provides the steps 13 and 14 for the upper and lower surfaces of the ring body 11, the splashes of resist and the resist filaments, which have been conveyed behind the barrier 12 and caught by the upper and lower surfaces of the ring body 11, are prevented from flowing inwardly over the barrier 12 and, accordingly, from splashing on the wafer.

Thirdly, the first and second effects mentioned above permit the cup to be compactly designed.

It is advantageous that, in addition to the structure mentioned above, the lower surface of the ring body 11 of the deflector ring DR is roughly finished surface. This feature provides the effect that the resist is securely caught by the lower surface of the ring body and prevented from flowing towards the ring barrier 12. However, regarding the upper side of the ring body 11, even if it is not roughly finished, there is almost no possibility of flowing out of the resist.

It is desirable that the cup SC and the deflector ring DR be made of aluminum (Al) and be coated with resin (for example, "Teflon"). This is for the purpose of preventing the cup and deflector ring from being deformed by an organic solvent when being washed after use. There is also the advantage that the cup and the deflector ring made of aluminum, in comparison with the cup made of resin, presents a large frictional resistance, thereby resulting in less occurrence of resist balls and resist filaments.

Figure 3:
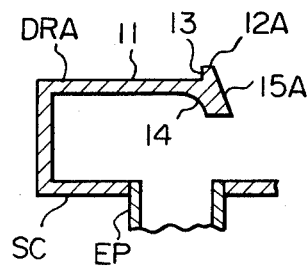
FIG. 3 is a view similar to FIG. 2, but illustrating another embodiment of a form of the deflector ring.

Another embodiment of the form of the deflector ring according to the present invention is illustrated in FIG. 3. This deflector ring DRA, in comparison with the deflector ring DR in FIG. 2, is different in that an inner circumferential surface 15A of a ring barrier 12A is a tapered surface which flares upwardly (i.e. towards the side near the cover) only. In this case also, the air current flowing along the barrier inner surface 15A is conveyed behind the barrier 12A, thereby providing substantially the same effect as that according to the form of the deflector ring in FIG. 2.

Figure 4:
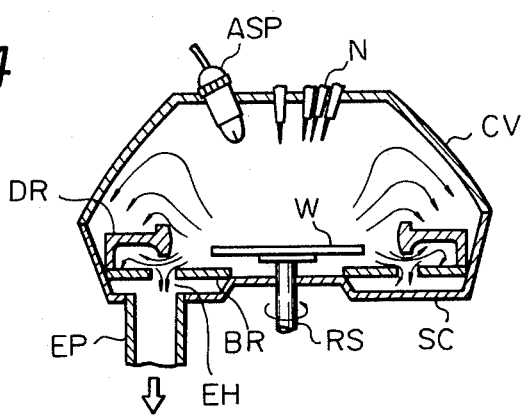
FIG. 4 is an axial sectional view diagrammatically illustrating a general construction of a second embodiment of a spinner according to the present invention.
Figure 5:
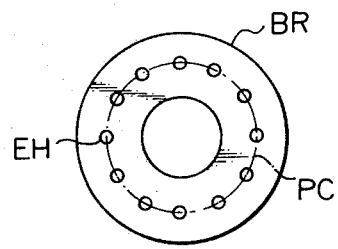
FIG. 5 is a plan view of a base ring.
Figure 6:
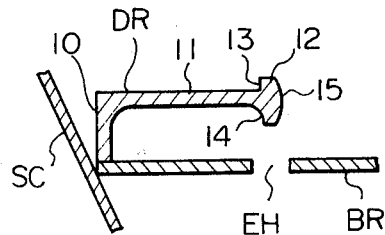
FIG. 6 is an enlarged sectional view of a portion of the second embodiment.

In FIGS. 4 through 6, a second embodiment of the structure of the spinner cup according to the present invention is illustrated. The structure of this embodiment, in comparison with the embodiment in FIG. 1, is different in that the cup SC is provided, in addition to the deflector ring DR, with a base ring BR, and these deflector ring DR and base ring BR are formed as separate parts from the cup, and are secured to the cup. The deflector ring DR is the same from the point of view of its basic form as the deflector ring in FIG. 2, but has an outer peripheral wall 10 which has a lower end resting on the outer peripheral portion of the base ring BR. The base ring BR has a form as illustrated in FIG. 5 and rests by its outer and inner peripheral edges on the cup, with a space defined between the base ring and the bottom wall of the cup. The base ring is normally formed of a resin (for example, "Teflon") and provided with a plurality (twelve in the illustrated embodiment) of small holes EH for air evacuation, which are arranged approximately equidistantly in the circumferential direction. Therefore, the interior of the cup SC is communicated with the evacuation port EP in the cup bottom wall, via the evacuation holes EH in the base ring BR. This structure provides an advantage that evacuation of air from the interior of the cup is performed substantially evenly at the respective evacuation holes EH in the base ring BR and, hence, even though there is only one evacuation port EP in the cup bottom wall, the air evacuation is made substantially even in the circumferential direction of the wafer, as described hereinbefore.

An important characteristic feature in the structure of the second embodiment resides in the fact that the barrier 12 of the deflector ring DR is in alignment with the evacuation holes EH in the base ring BR in the axial direction of the spindle RS. Therefore, the barrier 12 has a diameter which is approximately equal to that of the pitch circle PC of the evacuation holes EH in the base ring. According to this structure, when the resist adheres to the inner surface 15 of the deflector ring barrier 12, the resist, under the influence of the air currents directed to the respective evacuation holes EH is gradually collected at the lower end of the barrier to form a drop, which finally falls through the evacuation hole EH. This effect results in a smooth and effective discharging of the resist without an adhesion to the base ring. The second embodiment provides the above mentioned advantages due to the improved form of the deflector ring in the first embodiment, and in addition, provides an evenness to the air current to be evacuated and the smooth discharging of the resist due to the existence of the base ring.

Figure 7:
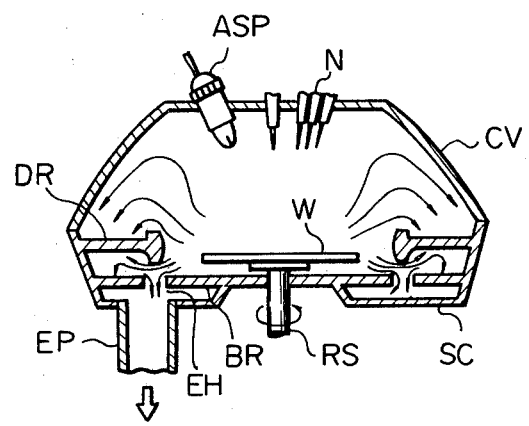
FIG. 7 is an axial sectional view diagrammatically illustrating a general construction of a modified embodiment of the second embodiment.
Figure 8:
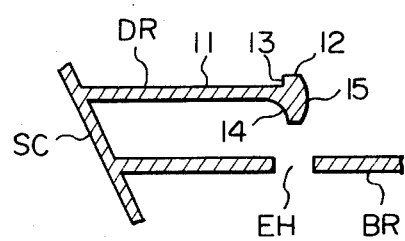
FIG. 8 is an enlarged sectional view of a portion of the embodiment in FIG. 7.

In the second embodiment illustrated in FIGS. 4 through 6, the cup SC, deflector ring DR and base ring BR are separate parts from each other, but any two or all of them may be formed as one part. For example, a structure in which the three portions SC, DR and BR are integrally formed as one part is illustrated in FIGS. 7 and 8.

Figure 9:
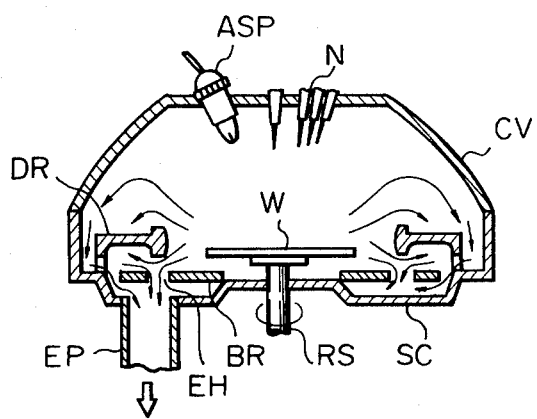
FIG. 9 is an axial sectional view diagrammatically illustrating a general construction of a third embodiment of a spinner according to the present invention.
Figure 10:
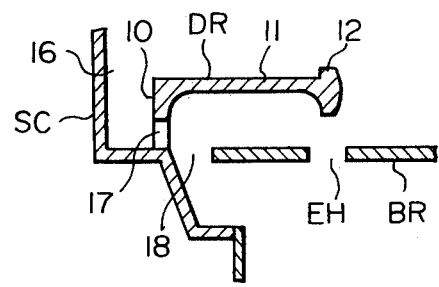
FIG. 10 is an enlarged sectional view of a portion of the third embodiment.

A third embodiment of the structure of the cup according to the present invention is illustrated in FIGS. 9 and 10. This embodiment is similar to the second embodiment in FIG. 4 from the point of view of the basic structure, but the structures of the cup SC and deflector ring DR are slightly different from those of the second embodiment. As is obvious from FIG. 10, an annular space 16 is defined between the side wall of the cup SC and the outer peripheral wall 10 of the deflector ring DR. The deflector ring DR has the same form as that as illustrated in FIG. 6, but is provided in the lower end portion of the outer wall 10 with a plurality (for example, four) of semicircular holes 17 for air evacuation. Furthermore, a passageway 18 for air evacuation is defined between the base ring BR and the cup SC. The passageway 18 can be provided in the form of either semicircular notches, which are formed in the outer peripheral portion of the base ring BR and in alignment with the respective evacuation holes 17, or an annular space, which is defined by forming the base ring BR so that it has a slightly reduced diameter. In this structure, the interior of the cup SC is communicated with the air evacuation port EP in the cup bottom wall, via a first route through the evacuation holes EH in the base ring BR as mentioned hereinbefore and, in addition, a second route through the annular space 16, the evacuation holes 17 and the passageway 18. Hence, the ascending air current flowing upwardly above the deflector ring DR is effectively evacuated via the second route without staying in the upper region of the interior of the cup. Accordingly, the capturing of the splashes of resist and the resist balls accompanying the ascending air current is improved as compared with that in the second embodiment. In this structure, however, there is the possibility that a part of the air current which has passed through the evacuation hole 17 on the second route will return to the interior of the cup through the space between the deflector ring DR and the base ring BR, so as to disturb the air current in the interior of the cup, thereby causing resist filaments to be produced.

Figure 11:
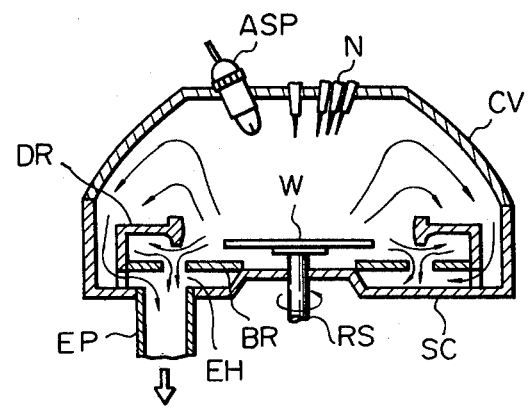
FIG. 11 is an axial sectional view diagrammatically illustrating a general construction of a modified embodiment of the third embodiment.
Figure 12:
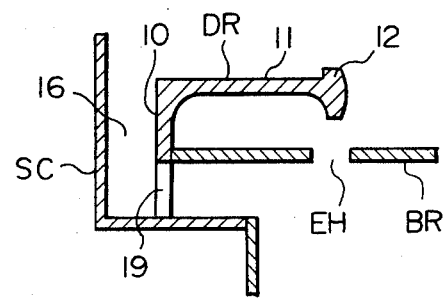
FIG. 12 is an enlarged sectional view of a portion of the embodiment in FIG. 11.

An improved embodiment to overcome the above mentioned problem is illustrated in FIGS. 11 and 12. The deflector ring DR in this embodiment is basically similar in form to that illustrated in FIG. 6, but the outer circumferential wall 10 has a lower end portion which projects below the base ring BR, and this projected lower end portion is provided with holes 19 for air evacuation. Therefore, the annular space 16 is communicated with the evacuation port EP in the cup bottom wall through the evacuation holes 19. This structure eliminates the return of the air current to the interior of the cup.

It should be noted that, in the embodiment illustrated in FIGS. 9 and 10, the deflector ring DR can be provided on the lower surface thereof with blades (not shown) diverging in the direction of rotation of the rotating spindle RS, for preventing air to be evacuated from returning to the interior of the cup through the space between the deflector ring DR and the base ring BR.

In the second and third embodiments, and the modified and improved embodiments thereof, illustrated in FIGS. 4 through 12, the basic form of the deflector ring is the same as that of the deflector ring DR in FIG. 2. However, it should be understood that the basic form of the deflector ring DRA in FIG. 3 or other similar forms can be used with any of the embodiments.

As mentioned above, the present invention provides a structure of the spinner cup, in which: even if application agents in a wide range of viscosity are used, the unevenness of application, i.e. "firework", does not occur; and; since the production of resist balls and resist filaments is rare, and, when produced, they are without fail caught by the deflector ring, the adhesion thereof to the wafer can be completely prevented. Accordingly, a very high qaulity of application can be realized.

An experiment was performed, in which two groups of one hundred wafers were applied with a resist by using, for one of the groups of wafers, the conventional "Wafertrac", manufactured by GCA Co., and, for the other group of wafers, the spinner of the second embodiment (FIGS. 4 through 6) according to the present invention. The result of this experiment was that the number of the wafers to which resist filaments adhered was, in the above mentioned former group of wafers, nineteen (i.e. the rate of occurrence of defect was 19/100) and in the above mentioned latter group of wafers, zero (i.e. the rate of occurrence of defect is 0/100). This experimental result proves the effectiveness of the structure of the cup according to the present invention.

The invention has been described in detail with particular reference to preferred embodiments thereof, but it will be understood that variations and modifications can be effected within the spirit and scope of the invention.

We claim:

1. A spinner comprising: a rotating spindle for causing a workpiece to spin at a high speed, and a cup disposed around said spindle and provided at a bottom wall thereof with a port for air evacuation, said cup comprising a deflector ring disposed in the interior of the cup and extending inwardly, said deflector ring having an annular barrier at the inner peripheral edge for defining steps projecting from the upper and lower surfaces of the ring, respectively, said barrier having an inner peripheral surface formed to diverge at least upwardly with respect to the axis of the spindle, and wherein said deflector ring has an outer peripheral wall for defining with the side wall of the cup an annular space therebetween, said outer peripheral wall of the deflector ring being provided with a plurality of holes for air evacuation arranged approximately equidistantly in the circumferential direction, whereby the interior of the cup is also in communication with the air evacuation port in the bottom wall of the cup, via a second route including said annular space and the air evacuation holes in the outer peripheral wall of the cup.

2. A spinner according to claim 1, wherein said cup further comprises a base ring disposed under said deflector ring with a space defined between the base ring and the bottom of the cup, said base ring being provided with a plurality of holes for air evacuation arranged approximately equidistantly in the circumferential direction, the interior of the cup being in communication with said evacuation port in the cup bottom wall through said air evacuation holes in the base ring, said barrier of the deflector ring and said air evacuation holes in the base ring being in alignment with each other in the axial direction of said spindle.

3. A spinner comprising: a rotating spindle for causing a workpiece to spin at a high speed, and a cup disposed around said spindle and provided at a bottom wall thereof with a port for air evacuation, said cup comprising (i) a deflector ring disposed in the interior of the cup and extending inwardly, said deflector ring having an annular barrier at the inner peripheral edge for defining steps projecting from the upper and lower surfaces of the ring, respectively, said barrier having an inner peripheral surface formed to diverge at least upwardly with respect to the axis of the spindle, and (ii) a base ring disposed under said deflector ring with a space defined between the base ring and the bottom of the cup, said base ring being provided with a plurality of holes for air evacuation arranged approximately equidistantly in the circumferential direction, the interior of the cup being in communication with said evacuation port in the cup bottom wall through said air evacuation holes in the base ring, said barrier of the deflector ring and said air evacuation holes in the base ring being in alignment with each other in the axial direction of said spindle, and wherein said deflector ring has an outer peripheral wall and the side wall of said cup, said outer peripheral wall of the deflector ring being provided with a plurality of holes for air evacuation arranged approximately equidistantly in the circumferential direction, whereby the interior of the cup is also in communication with the air evacuation port in the bottom wall of the cup, via a second route including said annular space and the air evacuation holes in the outer peripheral wall of the cup.

4. A spinner according to claim 3, wherein said cup and the base ring define a passageway for air evacuation therebetween, whereby said second route leads to said air evacuation port in the cup through said air evacuation pasageway.

5. A spinner according to claim 3, wherein said outer peripheral wall of the deflector ring has a lower end portion projecting below said base ring, said projected lower end being provided with said air evacuation holes.

6. A spinner according to claim 1, wherein said inner peripheral surface of the barrier is formed to diverge both upwardly and downwardly with respect to the axis of the spindle.

* * * * *

UNITED STATES PATENT AND TRADEMARK OFFICE
CERTIFICATE OF CORRECTION

PATENT NO. : 4,393,807

DATED : July 19, 1983

INVENTOR(S) : Fujimura et al.

It is certified that error appears in the above—identified patent and that said Letters Patent is hereby corrected as shown below:

Column 3, line 10, "comprises" should be --comprise--.

Column 4, line 66, after "is" insert --a--.

Column 5, line 66, after "EH" insert --,--.

Column 7, line 20, ";" (second occurrence) should be --,--;
line 24, "qaulity" should be --quality--.

Signed and Sealed this

Tenth Day of July 1984

[SEAL]

Attest:

GERALD J. MOSSINGHOFF

Attesting Officer

Commissioner of Patents and Trademarks